US005534383A

United States Patent [19]

Takahashi et al.

[11] Patent Number: 5,534,383

[45] Date of Patent: Jul. 9, 1996

[54] IMAGE TRANSFER SHEET, ITS LAMINATE AND IMAGE FORMING METHOD

[75] Inventors: Yonosuke Takahashi; Naoya Imamura; Hideyuki Nakamura; Kouya Kawabata, all of Shizuoka, Japan

[73] Assignee: Fuji Photo Film Co., Ltd., Kanagawa, Japan

[21] Appl. No.: 512,762

[22] Filed: Aug. 9, 1995

[51] Int. Cl.$^{6}$ .............................. G03C 8/42; G03C 1/76; G03F 7/039

[52] U.S. Cl. .......................... 430/201; 430/200; 430/257; 430/273; 430/961

[58] Field of Search .................................. 430/200, 201, 430/273, 961

[56] References Cited

U.S. PATENT DOCUMENTS

| | | | |
|---|---|---|---|
| 4,772,582 | 9/1988 | DeBoer | 430/201 |
| 5,256,506 | 10/1993 | Ellis et al. | 430/201 |
| 5,278,023 | 1/1994 | Bills et al. | 430/201 |

*Primary Examiner*—Richard L. Schilling
*Attorney, Agent, or Firm*—Birch, Stewart, Kolasch & Birch

[57] ABSTRACT

An image forming method comprises the steps of applying a laser light imagewise and sequentially onto a laminate for image formation and separating the image receiving sheet from other materials of the laminate so as to keep on the image receiving sheet an imagewise transferred image formation layer comprising the thermoplastic resin and pigment. The laminate for image formation comprises, an image transfer sheet comprising, in order, a support sheet, a light-heat conversion layer containing a light-heat conversion material which absorbs a laser light and instantly produces a heat, a heat sensitive releasing layer containing a material which produces a gas upon receiving the heat produced in the light-heat conversion layer, and an image formation layer which comprises a thermoplastic resin and a pigment, and an image receiving sheet via a thermally fusible material in the form of a large number of dots or in the form of lines to divide an interface between the image formation layer and the image receiving sheet into different areas. The material of the heat sensitive releasing layer can be incorporated into the light-heat conversion layer.

10 Claims, 6 Drawing Sheets

IMAGE TRANSFER SHEET, ITS LAMINATE AND IMAGE FORMING METHOD

FIELD OF THE INVENTION

The present invention relates to an image transfer sheet, its laminate and an image forming method employing the laminate and a laser light. Particularly, the invention relates to an image forming method favorably employable for preparing a color proof in printing technology, that is, DDC (Direct Digital Color Proof) or a mask image, and relates to an image transfer sheet and its laminate.

BACKGROUND OF THE INVENTION

In the field of graphic art, a set of separated color images are prepared from a color original sheet using a lith type film, and a final color image sheet is prepared using the separated color images. Prior to the final printing, a color proof is generally prepared for checking any mistakes possibly introduced in the preparation of the set of separated color images and further checking whether color adjustment is required or not. A paper sheet is generally employed as the material for preparing the color proof because the color proof should be as analogous as the finally printed paper sheet. For the same reason, a pigment is preferably employed as coloring material. Further desired is a high resolution so that a half tone is precisely reproduced. Furthermore desired is an enhanced reliability of the process.

Recently, there arises a demand for a process for preparing a color proof by a dry process, namely, a development process using no developing solution.

At the present time, the stage prior to the printing, namely, a prepress, is highly computerized. Therefore, a process and material for directly reproducing a color proof from a set of digital signals is required. In such computalized system, it is needed to produce a color proof of extremely high quality. Generally, an image of at least 150 lines/inch is required. For preparing a proof of such high quality from digital signals, a laser light which is highly coherent and can be modulated by digital signals should be employed as a recording head. Therefore, it is required to develop a recording material which shows high sensitivity to a laser light and shows such high resolution as to reproduce a very fine dots.

Japanese Patent Provisional Publication (for PCT application) No. 2-501552 discloses a recording material which is employ-able for reproducing an image of very fine halftone by means of a laser light. The recording material comprises a transparent support, an image forming surface layer which turns fluidal upon receiving a heat, and an image forming material layer of porous or granular material. When a laser light is applied, the image forming material layer in the area exposed to the laser light is fixed onto the support. Then, the unexposed area of the image forming material layer is peeled off to leave an image formed of the exposed image forming material layer on he support.

In the above image forming method, the image is formed directly on the transparent support. Therefore, the employable support is limited. Further, it is not easy to prepare of an image of multi-color. Accordingly, this process is not appropriate for employment as a method for preparing a color proof which generally needs the use of a paper sheet (i.e., pulp paper sheet) and on which a multi-color image is generally formed.

Japanese Patent Provisional Publication No. 6-219052 describes an image transfer sheet which comprises a support, a light-heat conversion layer of a light-heat conversion material, a thermally activable releasing layer of very small thickness (such as 0.03 to 0.3 μm), and an image forming layer comprising a coloring material. In this image transfer sheet, the bonding force between the image forming layer and the light-heat conversion layer decreases in the area where a layer light is applied. Such decrease of the bonding force is caused by thermal deterioration of the releasing layer. If an image receiving sheet is beforehand provided on the image forming layer when the laser light is applied to the image transfer sheet, an image of the area exposed to the laser light is transferred onto the image receiving sheet. In this system, the transfer of image is accomplished by so called "ablation". In more detail, the releasing layer decomposes to produce a gas in the area exposed to the laser light, and hence the bonding strength between the light-heat conversion layer and the image forming layer decreases in that area. The image forming layer on that area is then transferred onto the image receiving sheet. The image forming system utilizing the "ablation" is favorable in that a paper sheet having an adhesive undercoat can be employed as the image receiving sheet and a multi-colored image with fine tone can be easily prepared by placing the image transfer sheets of different colors on the image receiving sheet by turns. Accordingly, this method is advantageously employable for preparing a color proof (particularly, DDCP: Direct Digital Color Proof) or an extremely fine mask image.

The above-mentioned color forming system of Japanese Patent Provisional Publication No. 6-219052 was invented by inventors including one of the inventors of the present inventors.

As a result of further study on the above color forming system, it has been noted that while the image formation using the image transfer sheet having the releasing layer in combination with an image receiving sheet provided on the transfer sheet gives a highly fine image, the obtained image sometimes is apt to be fogged. Such fogging is observed specifically when the laminate composed of the image transfer sheet and the image receiving sheet is kept for a certain period of time without separating the receiving sheet from the transfer sheet after it is exposed to the laser light. The fogging appears to be caused by transfer of the image forming layer in the unexposed area. Such fogging is unwelcome, particularly in the preparation of a color proof of high quality.

SUMMARY OF THE INVENTION

The present invention has an object to provide an improved image forming method which utilizes the ablation for the transfer of the image from an image transfer sheet to an image receiving sheet. Such improvement is particularly addressed to obviation of fogging, maintaining the high quality of the obtained image.

The improved method utilizes an image transfer sheet (Type I) comprising, in order, a support sheet, a light-heat conversion layer containing a light-heat conversion material which absorbs a laser light and instantly produces a heat, a heat sensitive releasing layer containing a material which produces a gas upon receiving the heat produced in the light-heat conversion layer, and an image formation layer which comprises a thermoplastic resin and a pigment and has on its surface a thermally fusible material in the form of a large number of dots or in the form of lines to divide the surface into different areas.

In the image forming method, the image transfer sheet is employed in the form of a laminate in combination with an image receiving sheet. Accordingly, the laminate (Type 1-L)

comprises an image transfer sheet comprising, in order, a support sheet, a light-heat conversion layer containing a light-heat conversion material which absorbs a laser light and instantly produces a heat, a heat sensitive releasing layer containing a material which produces a gas upon receiving the heat produced in the light-heat conversion layer, and an image formation layer which comprises a thermoplastic resin and a pigment, and an image receiving sheet via a thermally fusible material in the form of a large number of dots or in the form of lines to divide an interface between the image formation layer and the image receiving sheet into different areas.

In the image transfer sheet and the laminate, the material which produces gas upon receiving the heat produced in the light-heat conversion material can be incorporated into the light-heat conversion layer instead of placing on the light-heat conversion layer in the form of an independent layer.

Accordingly, the invention also resides in an image transfer sheet (Type 2) comprising, in order, a support sheet, a light-heat conversion layer containing a light-heat conversion material which absorbs a laser light and instantly produces a heat and a material which produces a gas upon receiving the heat produced by the light-heat conversion material, and an image formation layer which comprises a thermoplastic resin and a pigment and has on its surface a thermally fusible material in the form of a large number of dots or in the form of lines to divide the surface into different areas.

Further, the laminate for image formation according to the invention can a laminate (Type 2-L) which comprises, an image transfer sheet comprising, in order, a support sheet, a light-heat conversion layer containing a light-heat conversion material which absorbs a laser light and instantly produces a heat and a material which produces a gas upon receiving the heat produced by the light-heat conversion material, and an image formation layer which comprises a thermoplastic resin and a pigment, and an image receiving sheet via a thermally fusible material in the form of a large number of dots or in the form of lines to divide an interface between the image formation layer and the image receiving sheet into different areas.

The image forming method of the invention comprises the steps of:

applying a laser light imagewise and sequentially onto one of the above-mentioned laminates for image formation; and separating the image receiving sheet from other materials of the laminate so as to keep on the image receiving sheet an imagewise transferred image formation layer comprising the thermoplastic resin and pigment.

DETAILED DESCRIPTION OF THE INVENTION

The invention is further described with reference to the attached drawings.

Figure 1:
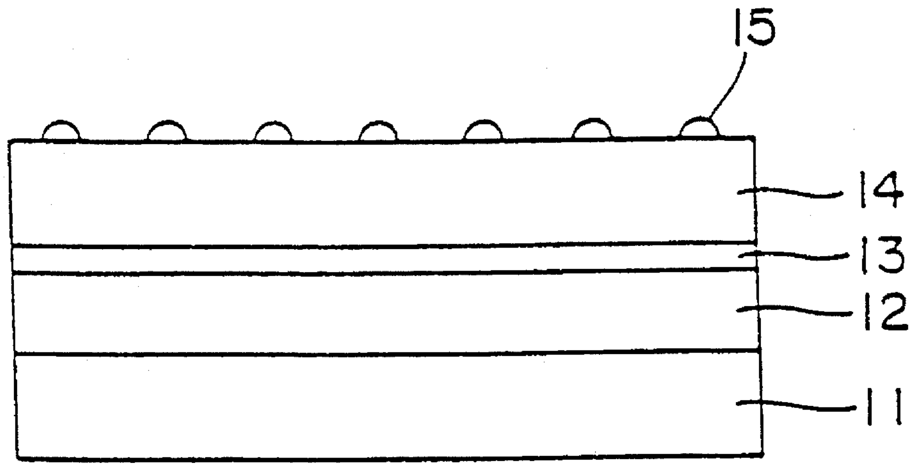
FIG. 1 shows a schematic view of a typical example of an image transfer sheet of Type 1 according to the invention.
Figure 2:
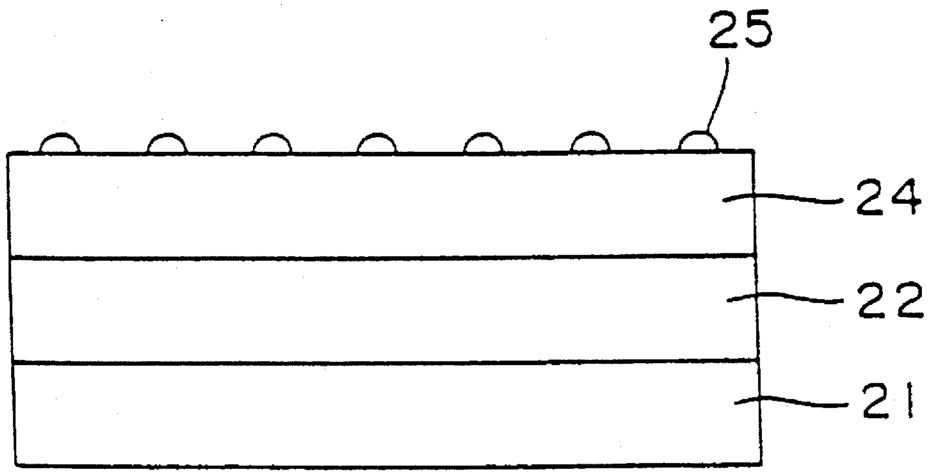
FIG. 2 shows a schematic view of a typical example of an image transfer sheet of Type 2 according to the invention.

The image transfer sheet employed in the invention is classified into two classes. The first type, namely Type 1, is illustrated in FIG. 1 and comprises a support 11, a light-heat conversion layer 12, a heat-sensitive releasing layer 13 and an image formation layer 14 which are arrange in order. On the image formation layer 14, a thermally fusible material 15 is placed in the form of a large number of dots or in the form of lines to separate the surface to give different areas. The second type, namely Type 2, is illustrated in FIG. 2 and comprises a support 21, a light-heat conversion layer 22 (which also serves as the heat-sensitive releasing layer) and an image formation layer 24 which are arrange in order. On the image formation layer 24, a thermally fusible material 25 is placed in the form of a large number of dots or in the form of lines to separate the surface to give different areas.

Figure 3:
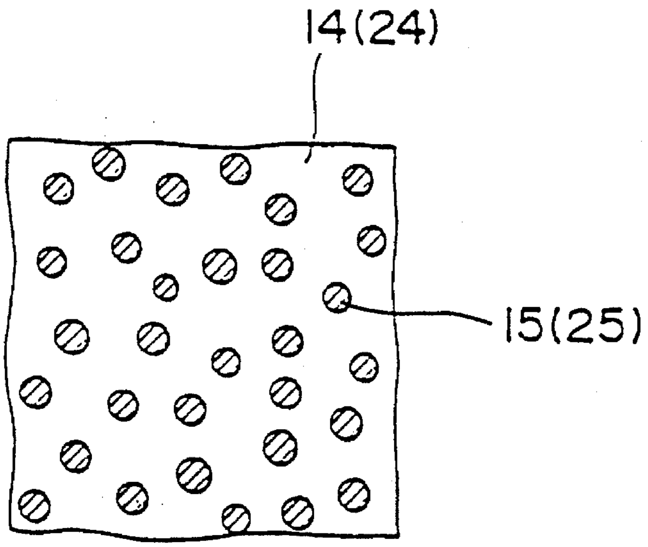
FIG. 3 shows a typical pattern of a heat fusible material provided on the surface of the image formation layer of the image transfer sheet according to the invention.
Figure 4:
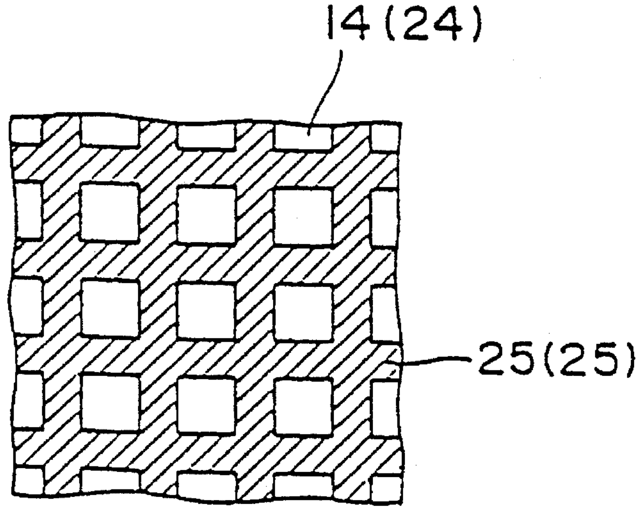
FIG. 4 shows another pattern of a heat fusible material provided on the surface of the image formation layer of the image transfer sheet of the invention.
Figure 5:
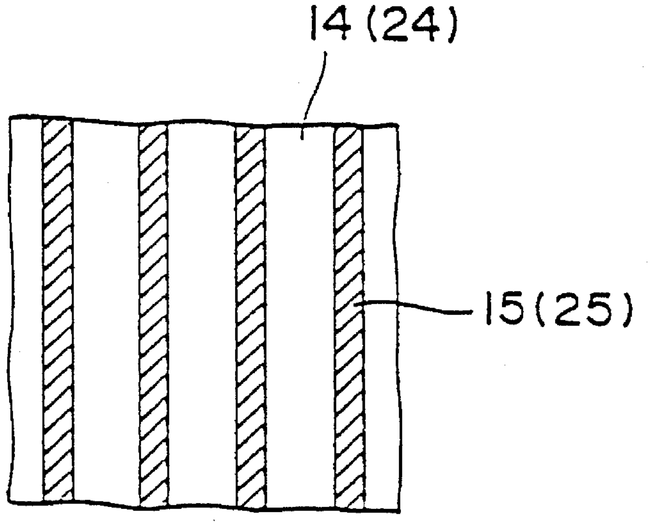
FIGS. 5 to 6 show other patterns of a heat fusible material provided on the surface of the image formation layer of the image transfer sheet of the invention.
Figure 6:
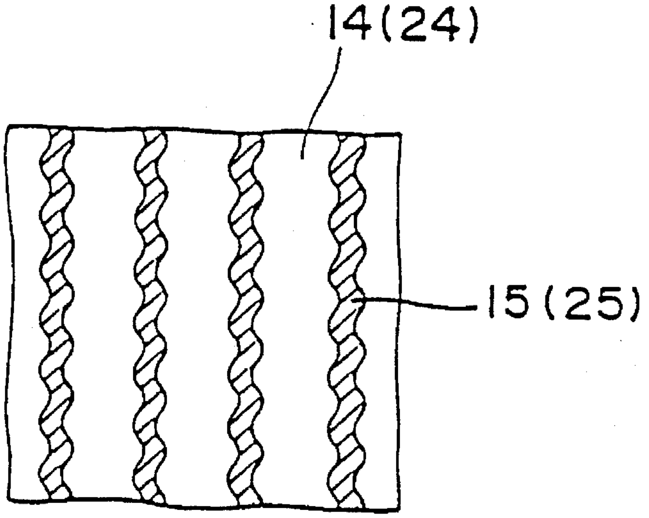

On the surface of the image formation layer, the thermally fusible material is placed in a certain pattern. Examples of the patterns are illustrated in FIGS. 3 to 6. FIG. 3 shows a typical dot pattern 15 (25) formed on the surface of the image formation layer 14 (24). The dot pattern may be a pattern of spots or a pattern of islands. The pattern may be a pattern of chess board as illustrated in FIG. 4. The pattern may be of a set of lines formed in parallel with each other, as illustrated in FIG. 5. The patter may be of a set of waved lines formed in parallel with each other, as shown in FIG. 6.

Figure 7:
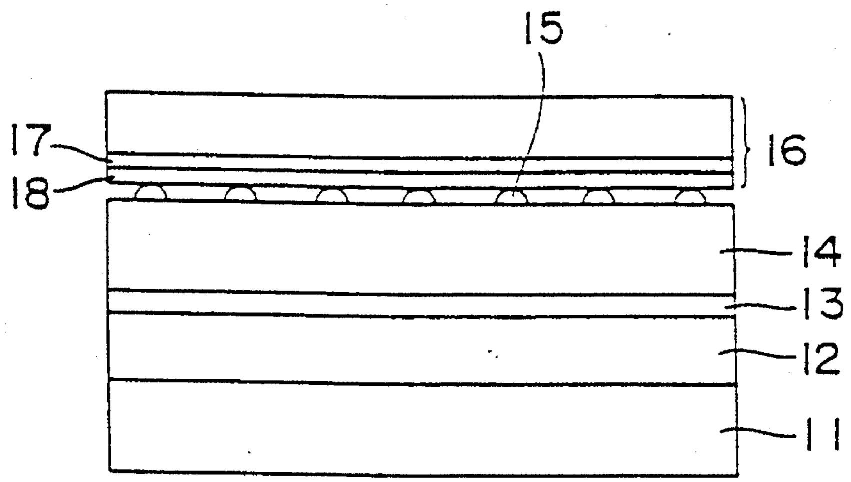
FIG. 7 shows a schematic view of a typical example of a laminate for image formation according to Type 1-L of the invention.
Figure 8:
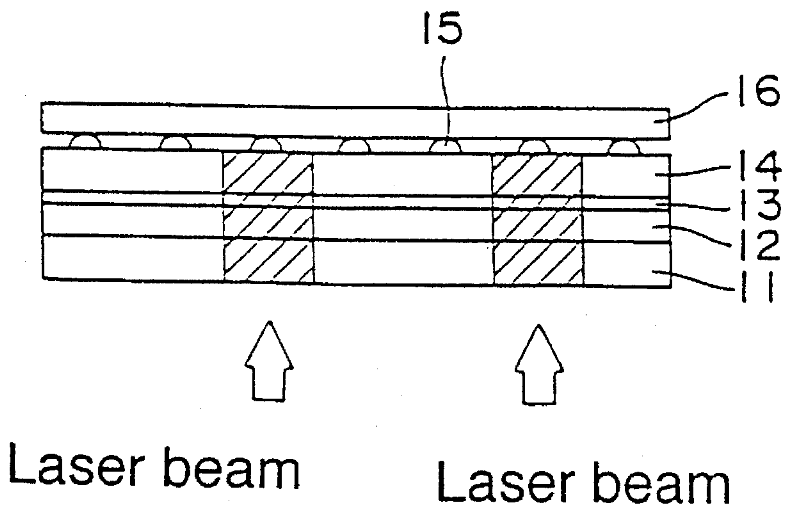
FIG. 8 shows a schematic view of the step for applying a laser light to the laminate of FIG. 7.
Figure 9:
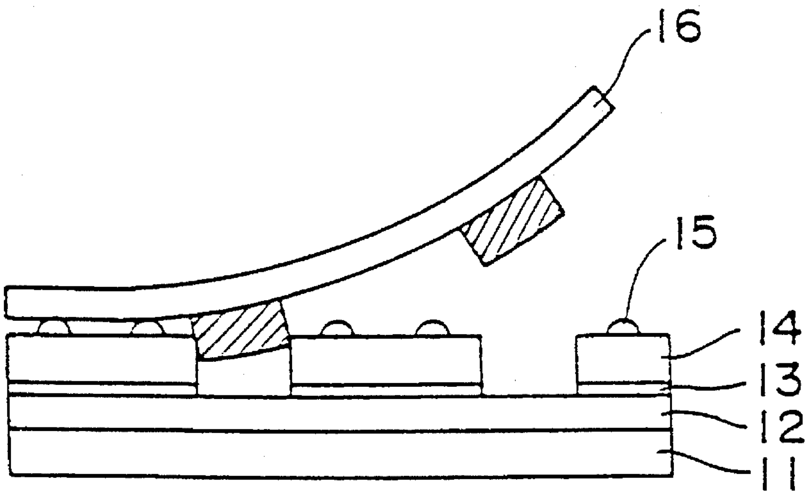
FIG. 9 shows a schematic view of an image transferred and formed on the image receiving sheet after separating the image receiving sheet from the laminate of FIG. 7.

FIG. 7 shows a laminate of Type 1-L which comprises an image transfer sheet of Type 1 (FIG. 1) and an image receiving sheet 16 placed on the image formation layer 14. The image receiving sheet 16 has two image receiving layers 17, 18. FIG. 8 shows a step of applying a laser light to the laminate of Type 1-L illustrated in FIG. 7. FIG. 9 shows a step of peeling off the image receiving sheet 16 so that an image of the pigment can be transferred and formed on the image receiving sheet 16.

Figure 10:
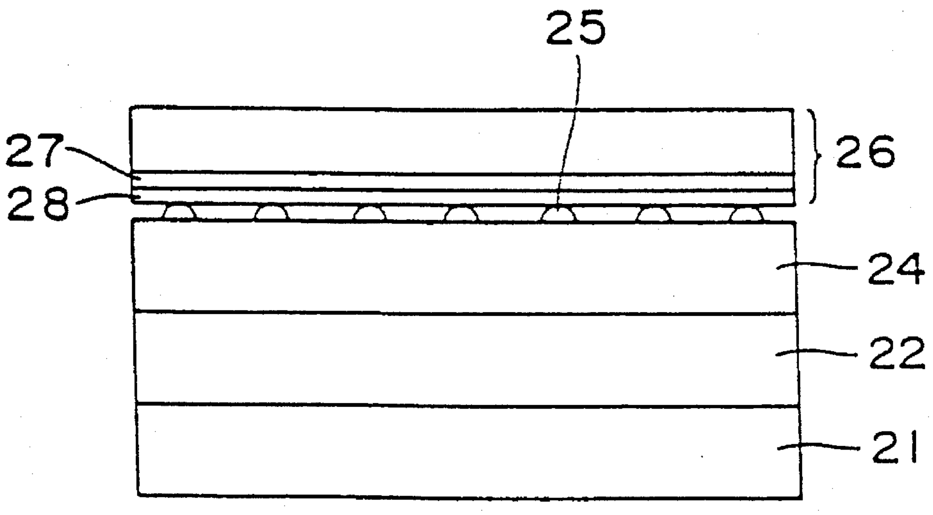
FIG. 10 shows a schematic view of a typical example of a laminate for image formation according to Type 2-L of the invention.
Figure 11:
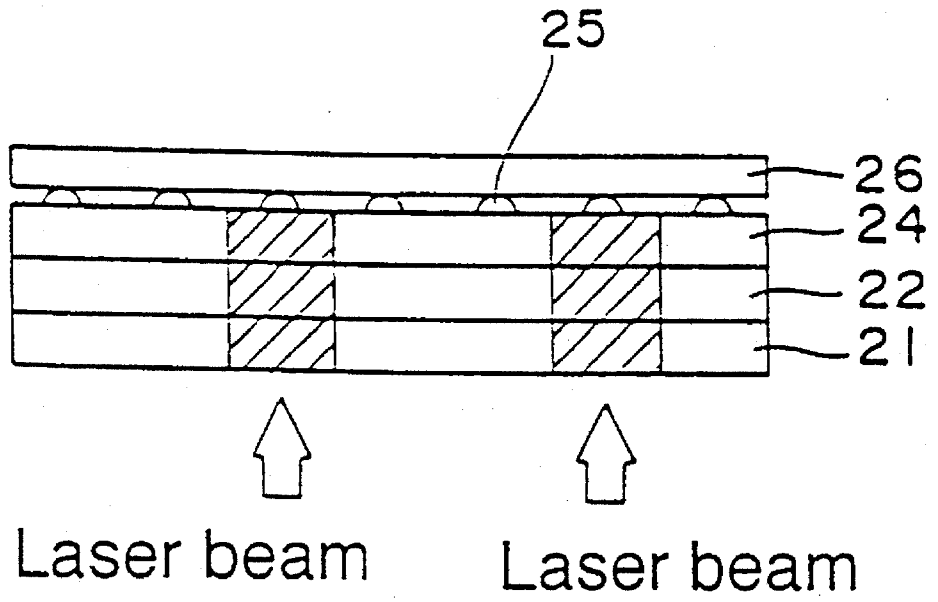
FIG. 11 shows a schematic view of the step for applying a laser light to the laminate of FIG. 10.
Figure 12:
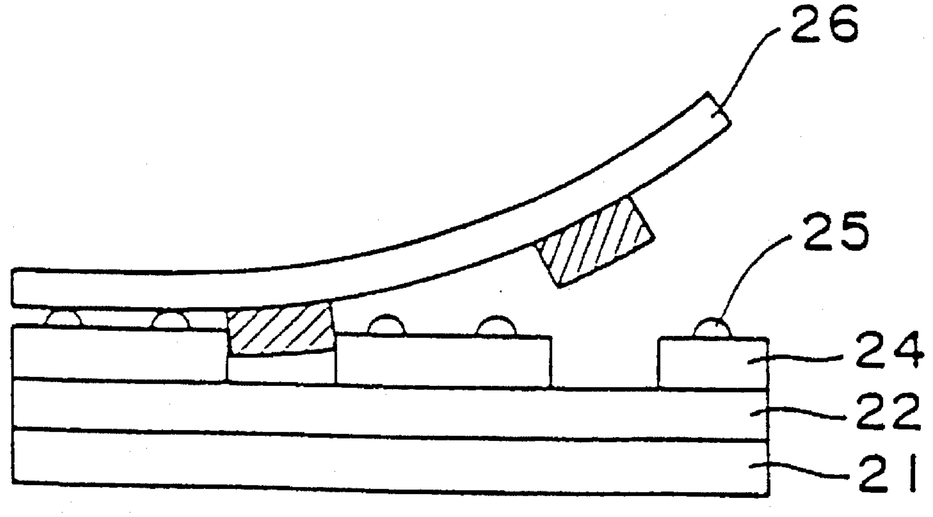
FIG. 12 shows a schematic view of an image transferred and formed on the image receiving sheet after separating the image receiving sheet from the laminate of FIG. 10.

FIG. 10 shows a laminate of Type 2-L which comprises an image transfer sheet of Type 2 (FIG. 2) and an image receiving sheet 26 placed on the image formation layer 24. The image receiving sheet 26 has two image receiving layers 27, 28. FIG. 11 shows a step of applying a laser light to the laminate of Type 2-L illustrated in FIG. 10. FIG. 12 shows a step of peeling off the image receiving sheet 26 so that an image of the pigment can be transferred and formed on the image receiving sheet 26.

The image transfer sheets, the image receiving sheet, and materials for preparing them are described below.

There are no specific limitations with respect to materials of the support of the image transfer sheet. Various support materials can be employed. Examples of the support materials are sheets of synthetic resins such as polyethylene terephthalate, polyethylene-2,6-naphthalate, polycarbonate, polyethylene, polypropylene, poly(vinyl chloride), poly(vinylidene chloride), polystyrene, and styrene-acrylonitrile copolymer. Particularly preferred is a sheet of polyethylene terephthalate which has been biaxially extended, because it is physically strong and has a high dimensional stability at different temperatures. In the case that the image forming method of the invention is employed for the preparation of a color proof, the sheet preferably is a transparent sheet through which a laser light can pass.

The support of the image transfer material preferably has one or more undercoating layers on its surface so as to increase adhesion of the light-heat conversion layer onto the support. Otherwise, a surface activating treatment is applied to the surface of the support for the increase of adhesion. Examples of the surface activating treatments include glow discharge treatment and corona discharge treatment. The material of the undercoating layer should provide high adhesion between the support and the light-heat conversion layer, and the material further should show low thermal conductivity and high resistance to heat. Examples of the materials of the undercoating include styrene, styrene-butadiene copolymer, and gelatin. The undercoating layer generally has a thickness (total thickness when two or more undercoating layers are formed) of 0.01 to 2 μm.

The support of the image transfer sheet has an anti-reflection layer or other auxiliary layers on the other side. The other side of the support may be subjected to appropriate surface treatments.

The light-heat conversion layer of the image transfer sheet of Type 1 comprises a coloring material (e.g., dye or colored pigment) which absorbs a laser light and a binder. If the light-heat conversion layer is provided only to absorb a laser light, the light-heat conversion layer may comprises the dye alone. However, the image transfer sheet of the invention is employed in combination with an image receiving sheet, and the step of separating the image receiving sheet from the image transfer sheet is involved. Therefore, the light-heat conversion layer should have a satisfactory self-supporting property and a high adhesion to the support. The binder serves to give the required self-supporting property and adhesion to the light-heat conversion layer. If the light-heat conversion layer is made of a vacuum deposited metal layer, there is no need of using a binder.

Examples of the coloring materials (dyes or pigments) include black pigments such as carbon black, pigments of large ring compound types such as phthalocyanine and naphthalocyanine which shows absorption in the visible light region through a near infrared ray region, organic dyes such as cyanine dyes (e.g., indolenine dye), anthraquinone dyes, azulene dyes, and phthalocyanine dyes which are employed as laser-light absorbing material in optical discs, and dyes of organic metal compound type such as a dithiol-nickel complex compound. The light-heat conversion layer preferably has a small thickness to as to increase its sensitivity. Therefore, the cyanine dye or phthalocyanine dyes which highly absorb a laser light are preferably employed.

The laser light absorbing material of the light-heat conversion layer may be an inorganic material such as metal. The metal may be in the form of a powder (e.g., blackened silver) and employed in combination with a binder to form a layer. Alternatively, a metal is vacuum deposited on the support. Otherwise, an organic metal compound such as silver behenate is coated together with a reducing agent in the form of a solution or a film on the support. When the coated layer is heated, metal particles are deposited in-situ to form a light-heat conversion layer containing the laser light-absorbing metal particles.

There are no specific limitations with respect to the binder to be employed for preparing the light-heat conversion layer. Examples of the binders are homopolymers and copolymers of acrylic monomers such as acrylic acid, methacrylic acid, acrylic ester, and methacrylic ester; cellulose polymers such as methyl cellulose, ethyl cellulose and cellulose acetate; vinyl polymers and copolymers of vinyl compounds such as polystyrene, vinyl chloride-vinyl acetate, polyvinylpyrrolidone, poly(vinyl butyral) and poly (vinyl alcohol); condensation polymers such as polyester and polyamide, thermoplastic elastic polymers such as butadiene-styrene copolymer; and polymers which are prepared by polymerizing and cross-linking photopolymerizable or heatpolymerizable monomers such as epoxy compounds.

In the image forming process utilizing a laser light, the light-heat conversion layer produces much heat to increase the temperature of the layer to extremely high degree. The produced heat is transmitted to the heat sensitive releasing layer provided thereon. The heat sensitive releasing layer contains material which emits a gas upon receiving heat from the light-heat conversion layer. Such material may produced a gas upon thermal decomposition. Otherwise, the material may leave gaseous water which was adsorbed by or attached to the material. The production of gas in the heat sensitive releasing layer causes decrease the bonding strength between the light-heat conversion layer and the image formation layer in the area where the gas is produced. Therefore, in the case that the heat-sensitive releasing layer is independently provided, the binder of the light-heat conversion layer preferably has a heat resistance higher than that of the releasing layer. In other words, the binder of the light-heat conversion layer is relatively stable when the heat-sensitive releasing layer decomposes to produce a gas or release the adsorbed gas.

The heat-sensitive releasing layer may be omitted and the heat-sensitive material can be incorporated into the light-heat conversion layer. Even in this case, the heat-sensitive material produces a gas when the light-heat conversion layer emits heat, and decreases the binding strength between the light-heat conversion layer and the image formation layer directly provided thereon.

In the light-heat conversion layer comprising a coloring material (dye or pigment) and a binder, the coloring material and the binder are preferably used in a weight ratio of 1:5 to 10:1 (coloring material:binder), more preferably 1:3 to 3:1. If the amount of the binder is too small, coagulation force of the light-heat conversion layer lowers. The light-heat conversion layer having the low coagulation force is unfavorably transferred to the image receiving sheet together with the image of the image formation material. If the amount of the binder is too large, it is necessary to increase the thickness of the light-heat conversion layer so that the laser light absorption can be kept high. The light-heat conversion layer having a large thickness is disadvantageous because resolution of image decreases.

Accordingly, the thickness of the light-heat conversion layer comprising a coloring material and a binder generally is in the range of 0.05 to 2 μm, preferably is in the range of 0.1 to 1 μm. Moreover, the light-heat conversion layer shows a light absorption of not less than 70%, in terms of absorption of laser light.

As is described hereinbefore, the heat-sensitive material can be used to form the independent heat-sensitive releasing layer or is incorporated into the light-heat conversion layer to produce a gas in the light-heat conversion layer.

A typical example of the heat-sensitive material is heat-sensitive polymer which decomposes wholly or partly to produce a gas or which releases a gas which is adsorbed or attached to the polymer. Examples of the heat-sensitive polymers include self-oxidizing polymers such as nitrocellulose; halogenated polymers such as chlorinated polyolefin, chlorinated rubber, poly(vinyl chloride) and poly(vinylidene chloride); acrylic polymers containing water such as poly-(isobutyl methacrylate) by which water is adsorbed; cellulose esters having water such as ethyl cellulose by which water is adsorbed; natural polymers having water such as gelatin by which water is adsorbed.

Another typical example of the heat-sensitive material is a low molecular weight compound which decomposes to produce a gas such as a diazo compound or diazide compound which easily decomposes to emit a gas upon contact with a heat.

The decomposition or release of a gas preferably undergoes at a temperature of not higher than 280° C., more preferably in the range of 150° to 230° C.

The heat-sensitive polymer can be used alone or in combination with other polymers to form the heat-sensitive releasing layer. The heat-sensitive low molecular weight compound is preferably used in combination with other polymers which may be the heat-sensitive polymers or other polymers to form the heat-sensitive releasing layer. In this case, the heat-sensitive low molecular weight compound is mixed with a polymer in the ratio by weight of 0.02:1 to 3:1, particularly 0.05:1 to 2:1.

The heat-sensitive releasing layer generally has a thickness of 0.03 to 1 μm, preferably 0.05 to 0.5 μm, and preferably covers the whole surface of the light-heat conversion layer.

The independently provided heat-sensitive releasing layer of the image transfer sheet of Type 1 may decompose to produce a gas. This means that a portion of the releasing layer diminishes upon producing a gas or the coagulation of the releasing layer is in part broken. Such phenomenon lowers the bonding force between the light-heat conversion layer and the image formation layer. In certain cases, a portion of decomposed or broken heat-sensitive material of the releasing layer may be transferred to the image receiving sheet together with the imagewise transferred image formation layer. The transferred heat-sensitive material or its decomposition product may add unfavorable color to the image. Therefore, the heat-sensitive material preferably has color as little as possible (this means that the material is transparent to visible light). In more detail, the heat-sensitive releasing layer shows absorption of visible light as low as possible, such as not higher than 50%, more preferably not higher than 10%.

On the light-heat conversion layer, an image formation layer is placed directly (Type 2) or via the heat-sensitive releasing layer (Type 1). The image formation layer comprises a pigment for forming a visibly observable image and a thermoplastic binder.

The pigment is generally classified into an organic pigment and an inorganic pigment. The organic pigment is advantageous in imparting high transparency to the image formation layer, and the inorganic pigment is advantageous in its hiding power. When the image transfer sheet of the invention is employed for producing a color proof, an organic pigment of yellow, magenta, cyan or black corresponding or similar to the pigment actually employed for printing is used. Optionally employed is a metal powder or fluorescent pigment.

Examples of the preferred pigments include azo pigments, phthalocyanine pigments, anthraquinone pigments, dioxazine pigments, quinacridone pigments, isoindolinone pigments, and nitro pigments. Representative pigments are as follows:

1) Yellow pigments

Hanza Yellow G, Hanza Yellow 5G, Hanza Yellow 10G, Hanza Yellow A, Pigment Yellow L, Permanent Yellow NCG, Permanent Yellow FGL, Permanent Yellow HR 2) Magenta Pigments (Red Pigments)

Permanent Red 4R, Permanent Red F2R, Permanent Red FRL, Lake Red C, Lake Red D, Pigment Scarlet 3B, Bordeaux 5B, Alizarine Lake, Rohdamine Lake B 3) Cyane Pigments (Blue Pigments)

Phthalocyanine Blue, Victoria Blue Lake, Fast Sky Blue

4) Black Pigments

Carbon Black

Examples of the thermoplastic binders for the production of the image formation layer include cellulose derivatives such as methyl cellulose, ethyl cellulose and cellulose triacetate; homopolymers and copolymers of acrylic monomers such as acrylic acid, methacrylic acid, acrylic esters and methacrylic esters; vinyl polymers such as poly (vinyl chloride), poly(vinyl acetate), poly(vinyl butyral) and poly (vinyl formal); styrene polymers such as polystyrene and styrene-maleic acid copolymer; rubber polymers such as polybutadiene and polyisoprene; polyolefins and olefin copolymers such as polyethylene and ethylene-vinyl acetate copolymer; phenol resin; and ionomer resins. Preferred thermoplastic binders have Tg (glass transition temperature) of 30° to 120° C., and particularly preferred are poly(vinyl butyral ) and acrylic polymers. The thermoplastic binders preferably have a mean molecular weight of 5,000 to 100,000.

In the image formation layer, the pigment and thermoplastic binder are preferably incorporated in a ratio by weight of 0.5:1 to 4:1.

The image formation layer may further contain a plasticizer. Particularly in the case of forming a multi-colored image in which plural images of different colors are superposed in order on the image receiving sheet, a plasticizer is preferably incorporated into the image formation layer so as to increase adhesion between the layers respectively having the formed image of different color. Examples of the plasticizers include phthalic esters such as dibutyl phthalate, di-n-octyl phthalate, di(2-ethylhexyl) phthalate, dinonyl phthalate, dilauryl phthalate, butyl lauryl phthalate and butyl benzyl phthalate; esters of dibasic aliphatic carboxylic acids such as di(2-ethylhexyl) adipate and di(2-ethylhexyl sebacate); phosphoric acid triesters such as tricresyl phosphate and di(2-ethylhexyl) phosphate; polyol polyesters such as polyethylene glycol esters; and epoxy compounds such as epoxidized aliphatic carboxylic acid esters.

Also employable are acrylic esters such as polyethylene glycol dimethacrylate, 1,2,4-butanetriol trimethacrylate, trimethylolethane triacrylate, pentaerythritol triacrylate, pentaerythritol tetraacrylate, and dipentaethythritol polyacrylate. Such acrylic esters are advantageously employable in combination with compatible binder polymers.

The plasticizers can be employed alone or in combination. The plasticizer can be employed in a ratio by weight of a total amount of the pigment and binder to the plasticizer in the range of 100:2 to 100:15.

The image formation layer may further contain a surfactant and viscosity increasing agent in addition to the above-mentioned components.

The thickness (dry thickness) of the image formation layer varies depending upon the purpose of the image transfer sheet. Generally, the thickness does not exceed 10 μm, and preferably is in the range of 0.1 to 2 μm, more preferably in the range of 0.1 to 1.5 μm.

On the surface of the image formation layer of the image transfer sheet of the invention, a heat fusible material is placed in the form of dots or in the form of lines to divide the surface to give multiple areas. Otherwise, the heat fusible material can be provided on an image receiving sheet.

The heat fusible material fuses when the image formation layer is heated by the heat produced in the light-heat conversion layer. Accordingly, the heat fusible material preferably has a melting point or softening point of 40° to 160° C., and can be selected from mineral waxes, natural waxes and synthetic waxes.

Examples of the mineral waxes include petroleum waxes such as paraffin wax, microcrystalline wax, ester wax, oxidized wax; montan wax; ozokerite; and ceresine. Paraffin wax which is separated from crude oil and having a different melting point is most preferred.

Examples of the natural waxes include plant waxes such as carnauba wax, and Japan wax, and animal waxes such as beeswax, insect wax, shellac wax, and whale wax.

The synthetic wax generally a higher aliphatic compound and used as a lubricant. Examples of the synthetic waxes include the following:

1) Fatty acid wax

Straight chain saturated fatty acids having the formula of $CH_3(CH_2)_nCOOH$ (n is an integer of 6 to 28); e.g., stearic acid, behenic acid, palmitic acid, 12-hydroxystearic acid, and azelaic acid 2) Fatty acid ester wax Esters of the above fatty acids; e.g., ethyl stearate, lauryl stearate, ethyl behenate, hexyl behenate, and behenyl mirystate 3) Fatty acid amide wax Amides of the above fatty acids; e.g., stearic acid amide, and lauric acid amide 4) Fatty alcohol wax Straight chain saturated fatty alcohols having the formula of $CH_3(CH_2)_nOH$ (n is an integer of 6 to 28); e.g., stearyl alcohol Preferred synthetic waxes are higher fatty acid amides such as stearic acid amide and lauric acid amide.

The heat fusible material can be used singly or in combination.

The heat fusible material can be provided on the surface of the image formation layer in various manners.

For instance, the heat fusible material is mixed with the components (in solution) of the image formation layer, and the mixture solution was coated on the light-heat conversion layer or on the heat-sensitive releasing layer. When the mixture solution is dried, the heat fusible material deposits on the produced image formation layer in the form of discontinuous pattern such as a set of dots, spots or islands. In this case, the heat fusible material is preferably mixed with the components of the image formation layer at 1 to 30 weight % (solid basis, heat fusible material per the components of the image formation layer).

The heat fusible material can be printed on the image formation layer in the form of a predetermined pattern such as a set of lines or a chess board by known pattern printing methods such as gravure printing or screen printing. The pattern printing method can be employed for depositing the heat fusible material in the form of a set of dots, spots and islands on the image formation layer.

Preferably, the heat fusible material is so placed on the image formation layer that its dot or a portion of its line is present in each pixel (i.e., picture element) of the obtainable image.

The image formation layer is easily damaged if it is placed and handled with no covering. Therefore, the image transfer sheet is generally covered with an image receiving sheet on the side of the image formation layer. Thus covered image transfer sheet is as such stored, delivered and employed for image formation. However, the image transfer sheet can be treated with no covering or with other covering such as a protective plastic film such as polyethylene terephthalate film or polyethylene film.

The image receiving sheet to be employed in the laminate and image forming method of the invention is described below.

The image receiving sheet comprises a substrate in the form of a sheet such as plastic sheet, metal sheet, glass plate, or paper sheet, and generally has one or more receiving layer(s) on the substrate. Examples of the plastic sheets include polyethylene terephthalate sheet, polycarbonate sheet, polyethylene sheet, poly(vinyl chloride) sheet, poly (vinylidene chloride) sheet, polystyrene sheet, and styrene-acrylonitrile sheet. Examples of the paper sheets include printing paper and coated paper. The substrate of the image receiving sheet generally has a thickness of 10 to 400 μm, preferably 25 to 200 μm. The substrate may be subjected to an appropriate surface activating treatment such as corona discharge or glow discharge so that an image receiving layer or an image formation layer can be placed thereon smoothly.

The image receiving sheet preferably has one or more receiving layer(s) so that an image of the image formation material can be smoothly transferred onto the image receiving sheet from the image formation layer by ablation.

The image receiving layer comprises an organic polymer binder, preferably a thermoplastic polymer binder. Examples of the polymer binders include cellulose derivatives such as methyl cellulose, ethyl cellulose and cellulose triacetate; homopolymers and copolymers of acrylic monomers such as acrylic acid, methacrylic acid, acrylic esters and methacrylic esters; vinyl polymers such as poly (vinyl butyral), poly (vinyl pyrrolidone) and poly (vinyl formal); styrene polymers such as polystyrene; rubber polymers such as butadiene-styrene copolymer; and condensation polymers such as polyester and polyamide polyolefins. Preferred polymer binders have Tg (glass transition temperature) of lower than 90° C. so that it can smoothly receive the image from the image formation layer of the image transfer sheet. A plasticizer can be incorporated into the image receiving layer(s) so as to adjust the glass transition temperature of the image receiving layer (s).

The image forming method can be performed by once transferring the formed image onto the image receiving sheet and further transferred onto a printing paper from the image receiving sheet. In other words, the image receiving sheet attached to the image transfer sheet can be employed as a temporary image receiving sheet. In this case, at least one of the image receiving layers of the image receiving sheet is preferably made of a photocurable material. A representative example of the photocurable material comprises a photopolymerizable polyfunctional vinyl or vinylidene monomer which can produce a polymer by addition polymerization; an organic polymer binder; and a photopolymerization initiator (and optionally a thermalpolymerization inhibitor).

Examples of the polyfunctional vinyl or vinylidene monomers include unsaturated carboxylic acid esters (preferably acrylic acid and methacrylic acid) of polyols such as ethylene glycol diacrylate, glycerol triacrylate, ethylene glycol dimethacrylate, 1,3-propanediol dimethacrylate, polyethylene glycol dimethacrylate, 1,2,4-butanetriol trimethacrylate, trimethylolethane triacrylate, pentaerythritol dimethacrylate, pentaerythritol trimethacrylate, pentaerythritol tetramethacrylate, pentaerythritol diacrylate, pentaerythritol triacrylate, pentaerythritol tetraacrylate, dipentaerythritol polyacrylate, 1,3-propanediol diacrylate, 1,5-pentanediol dimethacrylate, and bisacrylate or bismethacrylate of polyethylene glycol having a molecular weight of 200 to 400; and unsaturated carboxlic acid amides such as amides of acrylic acid or methacrylic acid with α,ω-diamine whose alkylene chain may be cleaved at a carbon atom, and ethylene bismethacrylamide. Also employable are polyester acrylates or polyester methacrylate, that is, condensation products between polycarboxylic acid esters of polyalcohols and acrylic acid or methacrylic acid.

The organic polymer binder for the temporary image receiving sheet can be the thermoplastic resin binder which is previously described for the image receiving layer.

The photopolymerizable monomer and the organic polymer binder can be used in a weight ratio of 0.1:1.0 to 2.0:1.0.

The photopolymerization initiator preferably has absorption at a near ultraviolet ray region but has no or little absorption in a visible ray region. Examples of the photopolymerization initiators include aromatic ketones such as benzophenone, Michler's ketone [4,4'-bis(dimethylamino)benzophenone], 4-methoxy-4'-dimethylaminobenzophenone, 2-ethylanthraquinone, and phenonetraquinone; benzoin ethers such as benzoin methyl ether, benzoin ethyl ether, and benzoin phenethyl ether; benzoins such as benzoin, methylbenzoin, and ethylbenzoin; and dimers such as 2-(o-chlorophenyl)-4,5-diphenylimidazole dimer and 2-(o-chlorophenyl)-4,5-(m-methoxyphenyl)imidazole dimer.

The photopolymerization initiator is generally employed 0.1 to 20 wt. % per the photopolymerizable monomer.

In the case that the image forming method of the invention is applied to the preparation of a color proof, the image receiving layer of the temporary image receiving sheet is in the form of two layers. In the two layers, the uppermost image receiving layer is preferably made of a photo-curable layer, which is to be transferred together with the image of the image formation material transferred from the image transfer sheet onto the final image receiving sheet (i.e, printing paper sheet). Thus produced temporary image receiving sheet serves to give a finally transferred image which is highly analogous to the actually printed image.

The laminate for image formation according to the invention can be produced by placing the image receiving sheet on the image transfer sheet and then passing them through a calendar roll heated up to 130° C., preferably at a temperature of 100° C. or lower.

The image forming method of the invention is described below in more detail.

The image forming method of the invention comprises the steps of applying a laser light (or laser beam) imagewise and sequentially onto the laminate (Type 1-L or Type 2-L), and separating the image receiving sheet from other materials of the laminate so as to keep on the image receiving sheet an imagewise transferred image formation layer comprising the thermoplastic resin and pigment. The laminate of the image transfer sheet and the image receiving sheet can be formed just before the image forming method is performed.

The procedure for applying the laser light can be done under the condition that the image receiving sheet of the laminate is tightly placed on a recording drum (which has a large number of small openings on its surface and is connected to vacuum forming mechanism) by suction, and applying the laser light onto the surface of the support of the image transfer sheet. The laser light is scanned onto the surface in the width direction under the condition that the drum rotates at a constant angular velocity.

Examples of the laser lights include gas laser lights such as argon ion laser light, helium-neon laser light, and helium-cadmium laser light; semiconductor laser light such as YAG laser light; dye laser light, excimer laser light; and other solid laser lights. The laser light can be modified to reduce its wavelength into a half wavelength by using a secondary high frequency element. In the image forming method of the invention, the laser light emitted from the semiconductor laser is preferred because it give a laser light of high output power and modulation can be readily done.

In the image forming method of the invention, the laser light is preferably applied onto the image transfer sheet under the condition that the beam diameter formed on the light-heat conversion layer is in the range of 5 to 50 μm (particularly 6 to 30 μm). The scanning is preferably done at a velocity of not less than 1 m/sec., specifically not less than 3 m/sec.

The image forming method of the invention is favorably employable for the preparation of a black mask or a monocolor image. The image forming method is most favorably employable for the preparation of a multicolor image.

In order to prepare a multicolor image, three or four image transfer sheets having different color pigments are prepared. Each image transfer sheet is combined with a temporary image receiving sheet and exposed to a laser light which is modulated by a set of digital signals formulated by color separation. The image transfer sheet is peeled off from the image receiving sheet to form an image. Thus processed respective temporary image receiving sheets having images of different colors are finally placed in an appropriate order on a printing paper sheet. In this way, a color proof of multicolor image which has high similarity to the desired printing image can be prepared.

The invention is further described by the following examples, in which "part(s)" means "part(s) by weight", unless otherwise specified.

Example 1

(1) Preparation of Image Transfer Sheet

1) Preparation of coating solution for formation of light-heat conversion layer

The following components were mixed under stirring to prepare a coating solution for forming a light-heat conversion layer:

| | |
|---|---|
| Infrared rays absorbable dye (IR-820, produced by Nippon Chemical & Pharmaceutical Co., Ltd.) | 1.7 parts |
| Binder (polyamide acid varnish PAA-A, produced by Mitsui-Toatsu Chemical | 13 parts |

-continued

| | |
|---|---|
| Co., Ltd.) | |
| 1-Methoxy-2-propanol | 60 parts |
| Methyl ethyl ketone | 88 parts |
| Surfactant (Megafac F-177, produced by Dainippon Ink and Chemicals, Co., Ltd.) | 0.05 part |

2) Formation of light-heat conversion layer on support

On a polyethylene terephthalate film of 75 μm thick were coated a styrene-butadiene copolymer undercoating layer (thickness: 0.5 μm) and a gelatin undercoating layer (thickness: 0.1 μm) one on another to prepare a support sheet. The coating solution prepared in 1) above was coated on the undercoating layer of the support sheet using a wheeler for 1 min. The coated solution was dried in an oven at 100° C. for 2 minutes to form a light-heat conversion layer (thickness: 0.2 μm, measured using a pin-tracing film thickness meter; light absorption at wavelength 830 nm: 90%) on the support film.

3) Preparation of coating solution for formation of heat-sensitive releasing layer The following components were mixed under stirring to prepare a coating solution for forming a heat-sensitive releasing layer:

| | |
|---|---|
| Nitrocellulose (Type HIG 120, produced by Asahi Chemicals Co., Ltd.) | 1.3 parts |
| Methyl ethyl ketone | 26 parts |
| Propylene glycol monomethyl ether acetate | 40 parts |
| Toluene | 92 parts |
| Surfactant (Megafac F-177, produced by Dainippon Ink and Chemicals, Co., Ltd.) | 0.01 part |

4) Formation of heat-sensitive releasing layer on light-heat conversion layer

On the light-heat conversion layer was coated the above-obtained coating solution using a wheeler for 1 min. The coated solution was dried in an oven at 100° C. for 2 minutes to form a heat-sensitive releasing layer (thickness: 0.1 μm, measured on the same releasing layer formed on a rigid sheet, using a pin-tracing film thickness meter) on the light-heat conversion layer.

5) Preparation of coating solution for formation of magenta image formation layer The following components were mixed using a paint shaker (produced by Toyo Seiki Co., Ltd.) for 2 hours to prepare a mother composition of coating solution for forming magenta image formation layer:

| | |
|---|---|
| Polyvinyl butyral (Denka Butyral #2000-L, produced by Denki-Kagaku Co., Ltd.) | 12.6 parts |
| Coloring material (magenta pigment, Lionol Red 6B4290, C.I. Pigment Red 57:133, produced by Toyo Ink Co., Ltd.) | 18 parts |
| Dispersing agent (Solsperse S-20000, produced by ICI Japan Co., Ltd.) | 0.8 part |
| n-Propyl alcohol | 110 parts |
| Glass beads | 100 parts |

The following components were mixed under stirring to prepare a coating solution for forming a magenta image formation layer:

| | |
|---|---|
| Mother composition (obtained above) | 6 parts |
| n-Propyl alcohol | 60 parts |

-continued

| | |
|---|---|
| Stearic acid amide (m.p.: 109° C.) | 0.15 part |
| Surfactant (Megafac F-177, produced by Dainippon Ink and Chemicals, Co., Ltd.) | 0.01 part |

6) Formation of magenta image formation layer on heat-sensitive releasing layer

On the heat-sensitive releasing layer was coated the above-obtained coating solution using a wheeler for 1 min. The coated solution was dried in an oven at 100° C. for 2 minutes to form a magenta image formation layer (thickness: 0.3 μm, measured on the same magenta image formation layer formed on a rigid sheet, using a pin-tracing film thickness meter) on the heat-sensitive releasing layer.

The prepared magenta image formation layer showed an optical density of 0.7 (measured by using Macbeth Densitometer and green filter).

The magenta image formation layer was allowed to stand at room temperature for one day, and its surface was observed using a scanning type electronic microscope. It was confirmed that a great number of leaflike crystals of stearic acid amide were deposited and dispersed on the surface of the magenta image formation layer in the form of dots.

Thus, there was obtained an image transfer sheet comprising a support, a light-heat conversion layer, a heat-sensitive releasing layer, and a magenta image formation layer on which crystals of stearic acid amide were deposited and dispersed.

(2) Preparation of Image Receiving Sheet

1) Preparation of coating solution for formation of first image receiving layer

The following components were mixed under stirring to prepare a coating solution for forming a first image receiving layer:

| | |
|---|---|
| Poly(vinyl chloride) (Geon 25, produced by Nihon Geon Co., Ltd.) | 9 parts |
| Surfactant (Megafac F-177, produced by Dainippon Ink and Chemicals, Co., Ltd.) | 0.1 part |
| Methyl ethyl ketone | 120 parts |
| Toluene | 35 parts |
| Cyclohexanone | 20 parts |
| Dimethylformamide | 20 parts |

2) Formation of first image receiving layer on support

On a polyethylene terephthalate film of 75 μm thick was coated the above-obtained coating solution using a wheeler. The coated solution was dried in an oven at 100° C. for 2 minutes to form a first image receiving layer (thickness: 0.1 μm) on the support film.

3) Preparation of coating solution for formation of second image receiving layer The following components were mixed under stirring to prepare a coating solution for forming a second image forming layer:

| | |
|---|---|
| Methyl methacrylate/ethyl acrylate/methacrylic acid copolymer (Daiyanal BR-77, produced by Mitsubishi Rayon Co., Ltd.) | 17 parts |
| Alkyl acrylate/alkyl methacrylate copolymer (Daiyanal BR-64, produced by Mitsubishi Rayon Co., Ltd.) | 17 parts |
| Pentaerythritol tetraacrylate (A-TMMT, produced by Shin-Nakamura Chemicals, Co., Ltd.) | 22 parts |

-continued

| | |
|---|---|
| Surfactant (Megafac F-177P, produced by Dainippon Ink and Chemicals, Co., Ltd.) | 0.4 part |
| Methyl ethyl ketone | 100 parts |
| Hydroquinone monomethyl ether | 0.05 part |
| 2,2-dimethoxy-2-phenylacetophenone (photopolymerization initiator) | 1.5 parts |

2) Formation of second image receiving layer on first image receiving layer

On the first image receiving layer was coated the above-obtained coating solution using a wheeler. The coated solution was dried in an oven at 100° C. for 2 minutes to form a second image receiving layer (thickness: 26 μm) on the first image receiving layer.

There was obtained an image receiving sheet having two image receiving layers on a support film.

(3) Preparation of Laminate for Image Formation

The image transfer sheet and the image receiving sheet were independently allowed to stand at room temperature for one day, and the image receiving sheet was placed on the image transfer sheet under the condition that the image receiving layer was brought into contact with the magenta image formation layer. They were passed through a heat roller having a surface temperature of 70° C., at a pressure of 4.5 kg/cm$^2$ and at a rate of 200 cm/min., to give a laminate. It was confirmed using a thermocouple that the image transfer sheet and the image receiving sheet were heated to approx. 50° C.

(4) Installation of the laminate for image formation onto image recording apparatus The laminate obtained in (3) above was allowed to stand at room temperature for approx. 10 min. so as to sufficiently cool the laminate. The laminate was then placed on a rotatable drum having suction openings on the surface under the condition that the image receiving sheet was brought into contact with the surface of the drum. Then, the pressure of the inside of the rotatable drum was reduced to fix the laminate on its surface.

(5) Image Recording on the Laminate

Onto the surface of the image transfer sheet of the laminate on the drum under rotation (main-scanning) was applied a semiconductor laser light (wave length: 830 nm) to form a light spot of diameter of 7 μm on the surface of the light-heat conversion layer. The laser light was scanned in the width direction (sub-scanning) of the drum so that a set of digital signals were recorded on the image transfer sheet. The conditions of laser light application were as follows:

Laser power: 110 mW, velocity of main scanning: 10 m/sec., pitch of sub-scanning: 5 μm.

(6) Transfer of Image and Observation of Transferred Image

The laminate having been subjected to the image recording procedure was removed from the drum, and then the image receiving sheet was manually separated from the image transfer sheet. On the image receiving sheet was observed a sharp line image of 5.0 μm thick which corresponded to the area exposed to the laser light. Neither fogging caused by transfer of the image formation layer at unexposed area nor transfer of the light-heat conversion layer was observed.

Examples 2 to 6 and Comparison Example 1

An image transfer sheet was prepared in the same manner as in Example 1, except that the amount of stearic acid amide in the coating solution for forming the magenta image formation layer was varied as set forth in Table 1. The surface of the magenta image formation layer was then observed.

The prepared image transfer sheet having stearic acid amide was combined with the same image receiving sheet as prepared in Example 1 to give a laminate. The laminate was utilized for image formation in the same manner as in Example 1. Then, the image received on the image receiving sheet was precisely observed. The results are set forth in Table 1.

TABLE 1

| | Amount of Stearic Acid Amide (wt. %) | Width of Recorded Lines (μm) | Transfer of Unexposed area (Fogging) | Deposit of Stearic Acid Amide Crystals |
|---|---|---|---|---|
| Con. 1 | 0 | 6.5 | Observed | None |
| Ex. 2 | 2 | 6.0 | None | Observed |
| Ex. 3 | 5 | 5.7 | None | Observed |
| Ex. 4 | 10 | 4.9 | None | Observed |
| Ex. 5 | 20 | 4.6 | None | Observed |
| Ex. 6 | 30 | 4.0 | None | Observed |

Example 7

An image transfer sheet was prepared in the same manner as in Example 1, except that no stearic acid amide was incorporated into the coating solution for forming the magenta image formation layer, and that a solution of stearic acid amide (2 wt. %) in cyclohexane was placed on the surface of the magenta image formation layer by gravure printing in the form of a lattice pattern (width of lines: 10 μm, space: 30 μm, see FIG. 5 in the attached drawings).

The prepared image transfer sheet having stearic acid amide in the lattice pattern on the magenta image formation layer was combined with the same image receiving sheet as prepared in Example 1 to give a laminate. The laminate was utilized for image formation in the same manner as in Example 1. Then, the image received on the image receiving sheet was precisely observed. The image was sharp with no fogging as is observed in Example 1.

Example 8

(1) Preparation of Image Transfer Sheet

1) Formation of light-heat conversion layer and heat-sensitive releasing layer on support The light-heat conversion layer and the heat-sensitive releasing layer were formed on the support.

2) Preparation of coating solution for forming black mask image formation layer

The following components were mixed using a paint shaker (produced by Toyo Seiki Co., Ltd. ) for 2 hours to prepare a mother composition of coating solution for forming black mask image formation layer:

| | |
|---|---|
| Polyvinyl butyral (Denka Butyral #2000-L, produced by Denki-Kagaku Co., Ltd.) | 12.6 parts |
| Coloring material (Carbon black pigment, Type MA-100 produced by Mitsubishi Chemicals Co., Ltd.) | 24 parts |
| Dispersing agent (Solsperse S-20000, produced by ICI Japan Co., Ltd.) | 0.8 part |
| n-Propyl alcohol | 110 parts |
| Glass beads | 100 parts |

The following components were mixed under stirring to prepare a coating solution for forming a black mask image formation layer:

| | |
|---|---|
| Mother composition (obtained above) | 10 parts |
| Toluene | 6 parts |
| n-Propyl alcohol | 30 parts |
| Stearic acid amide (m.p.: 109° C.) | 0.07 part |
| Surfactant (Megafac F-177, produced by Dainippon Ink and Chemicals, Co., Ltd.) | 0.01 part |

3) Formation of black mask image formation layer on heat-sensitive releasing layer On the heat-sensitive releasing layer was coated the above-obtained coating solution using a wheeler for 1 min. The coated solution was dried in an oven at 100° C. for 2 minutes to form a magenta image formation layer (thickness: 0.9 μm, measured on the same black mask image formation layer formed on a rigid sheet, using a pin-tracing film thickness meter) on the heat-sensitive releasing layer. The prepared black mask image formation layer showed an optical density of 3.5 (at wave length of 360 nm, measured by using an optical densitometer)

The black mask image formation layer was allowed to stand at room temperature for one day, and its surface was observed using a scanning type electronic microscope. It was confirmed that a great number of leaflike crystals of stearic acid amide were deposited and dispersed on the surface of the magenta image formation layer in the form of dots.

Thus, there was obtained an image transfer sheet comprising a support, a light-heat conversion layer, a heat-sensitive releasing layer, and a black mask image formation layer on which crystals of stearic acid amide were deposited and dispersed.

(2) Preparation of Image Receiving Sheet

1) Preparation of coating solution for formation of image receiving layer

| | |
|---|---|
| Methyl methacrylate/ethyl acrylate/methacrylic acid copolymer (Daiyanal BR-77, produced by Mitsubishi Rayon Co., Ltd.) | 17 parts |
| Alkyl acrylate/alkyl methacrylate copolymer (Daiyanal BR-64, produced by Mitsubishi Rayon Co., Ltd.) | 17 parts |
| Pentaerythritol tetraacrylate (A-TMMT, produced by Shin-Nakamura Chemicals, Co., Ltd.) | 22 parts |
| Surfactant (Megafac F-177P, produced by Dainippon Ink and Chemicals, Co., Ltd.) | 0.4 part |
| Methyl ethyl ketone | 100 parts |
| Hydroquinone monomethyl ether | 0.05 part |
| 2,2-dimethoxy-2-phenylacetophenone (photopolymerization initiator) | 1.5 parts |

2) Formation of image receiving layer on support On a polyethylene terephthalate film of 75 μm thick were coated a styrene-butadiene copolymer undercoating layer (thickness: 0.5 μm) and a gelatin undercoating layer (thickness: 0.1 μm) one on another to prepare a support sheet. The coating solution prepared in 1) above was coated on the undercoating layer of the support sheet using a wheeler for 1 min. The coated solution was dried in an oven at 100° C. for 2 minutes to form an image receiving layer (thickness: 26 μm) on the support film.

There was obtained an image receiving sheet having an image receiving layer on a support film.

(3) Preparation of Laminate for Image Formation

The image transfer sheet and the image receiving sheet were treated in the same manner as in Example 1 to give a united laminate for image formation.

(4) Installation of the laminate for image formation onto image recording apparatus The laminate obtained in (3) above was fixed on the surface of a rotatable drum and the image recording and transfer procedure was performed in the same manner as in Example 1. There was obtained a transferred black mask image on the image receiving sheet.

(5) Preparation of Mask Image

The surface of the image receiving sheet having the back mask image was irradiated with ultraviolet rays using a ultraviolet ray irradiation printer for graphic art (Type PA-607, produced by Dainippon Screen Manufacturing Co., Ltd.) under the condition that the image receiving sheet was kept in a vacuum chamber, so as to cure the image receiving layer.

The cured image receiving layer was observed by optical microscope to confirm that the line width of the transferred image was 4 μm, and the optical density of the image area at a wave length of 350 to 450 nm was more than 3, while the optical density of non-image area was 0.1. Accordingly, it was confirmed that an image of high optical contrast was observed.

This example shows that the image transfer sheet of the invention is favorably employable for the formation of a mask image for printing procedure.

Example 9

An image transfer sheet was prepared in the same manner as in Example 1 except that N-hydroxyethyl-12-stearic acid amide (m.p.: 104° C.) was incorporated into the coating solution for forming magenta image formation layer in place of the stearic acid amide.

The image transfer sheet was then combined with the image receiving sheet of Example 1 to give a laminate for image formation, and the laminate was subjected to the image recording in the same manner as in Example 1.

There was observed microcrystalline N-hydroxyethyl-12-stearic acid amide in the form of needles which were deposited and dispersed on the surface of the magenta image formation layer.

On the image receiving sheet was formed a line image of 5.0 μm wide. Neither fogging nor transfer of the light-heat conversion layer was observed.

Example 10

An image transfer sheet was prepared in the same manner as in Example 1 except that N-butylstearic acid amide (m.p.: 67° C.) was incorporated into the coating solution for forming magenta image formation layer in place of the stearic acid amide.

The image transfer sheet was then combined with the image receiving sheet of Example 1 to give a laminate for image formation, and the laminate was subjected to the image recording in the same manner as in Example 1.

There was observed microcrystalline N-butylstearic acid amide deposited and dispersed on the surface of the magenta image formation layer.

On the image receiving sheet was formed a line image of 4.3 μm wide. Neither fogging nor transfer of the light-heat conversion layer was observed.

Example 11

(1) Preparation of Image Transfer Sheet

1) Preparation of coating solution for formation of light-heat conversion layer

The following components were mixed under stirring to prepare a coating solution for forming a light-heat conversion layer:

| | |
|---|---|
| Infrared rays absorbable dye (IR-820, produced by Nippon Chemical & Pharmaceutical Co., Ltd.) | 0.5 part |
| Binder (nitrocellulose, produced by Asahi Chemical Industries Co., Ltd.) | 1.5 parts |
| Methyl ethyl ketone | 125 parts |
| Surfactant (Megafac F-177, produced by Dainippon Ink and Chemicals, Co., Ltd.) | 0.01 part |

2) Formation of light-heat conversion layer on support

On a polyethylene terephthalate film of 75 μm thick were coated a styrene-butadiene copolymer undercoating layer (thickness: 0.5 μm) and a gelatin undercoating layer (thickness: 0.1 μm) one on another to prepare a support sheet. The coating solution prepared in 1) above was coated on the undercoating layer of the support sheet using a wheeler for 1 min. The coated solution was dried in an oven at 100° C. for 2 minutes to form a light-heat conversion layer ( thickness: 0.2 μm, measured using a pin-tracing film thickness meter; optical density at wavelength 830 nm: 1.0) on the support film.

3) Formation of black mask image formation layer on light-heat conversion layer

On the light-heat conversion layer was coated the coating solution for forming black mask image (prepared in Example 8) using a wheeler for 1 min. The coated solution was dried in an oven at 100° C. for 2 minutes to form a black mask image formation layer (thickness: 0.9 μm, measured on the same black mask image formation layer formed on a rigid sheet, using a pin-tracing film thickness meter) on the heat-sensitive releasing layer.

The prepared black mask image formation layer showed an optical density of 3.5 (measured at 360 nm, by using an optical densitometer).

The obtained black mask image formation layer was allowed to stand at room temperature for one day, and its surface was observed using a scanning type electronic microscope. It was confirmed that a great number of leaflike crystals of stearic acid amide were deposited and dispersed on the surface of the black mask image formation layer in the form of spots.

Thus, there was obtained an image transfer sheet comprising a support, a light-heat conversion layer, and a black mask image formation layer on which crystals of stearic acid amide were deposited and dispersed.

(2) Preparation of Laminate for Image Formation and Image Recording

The image transfer sheet obtained above was combined with the image receiving sheet of Example 8 to give a laminate for image formation, and the laminate was subjected to the image recording in the same manner as in Example 1, except that a dot generator was connected to the laser modulation circuit so as to output an image of half tone (dot image) of 200 lines/inch in the image recording procedure.

The image transferred onto the image receiving sheet had no fogging on the image area and reproduced 2 to 98% of the half tone.

We claim:

1. An image transfer sheet comprising, in order, a support sheet, a light-heat conversion layer containing a light-heat conversion material which absorbs a laser light and instantly produces a heat, a heat sensitive releasing layer containing a material which produces a gas upon receiving the heat produced in the light-heat conversion layer, and an image formation layer which comprises a thermoplastic resin and a pigment and has on its surface a thermally fusible material in the form of a large number of dots or in the form of lines to divide the surface into different areas.

2. The image transfer sheet of claim 1, wherein the image formation layer has a thickness of 0.1 to 1.5 μm.

3. The image transfer sheet of claim 1, wherein a ratio of the pigment to the thermoplastic resin in the image formation layer is in the range of 0.5/1 to 4/1.

4. A laminate for image formation which comprises, an image transfer sheet comprising, in order, a support sheet, a light-heat conversion layer containing a light-heat conversion material which absorbs a laser light and instantly produces a heat, a heat sensitive releasing layer containing a material which produces a gas upon receiving the heat produced in the light-heat conversion layer, and an image formation layer which comprises a thermoplastic resin and a pigment, and an image receiving sheet via a thermally fusible material in the form of a large number of dots or in the form of lines to divide an interface between the image formation layer and the image receiving sheet into different areas.

5. An image forming method comprising the steps of:

applying a laser light imagewise and sequentially onto the laminate for image formation of claim 4; and separating the image receiving sheet from other materials of the laminate so as to keep on the image receiving sheet an imagewise transferred image formation layer comprising the thermoplastic resin and pigment.

6. An image transfer sheet comprising, in order, a support sheet, a light-heat conversion layer containing a light-heat conversion material which absorbs a laser light and instantly produces a heat and a material which produces a gas upon receiving the heat produced by the light-heat conversion material, and an image formation layer which comprises a thermoplastic resin and a pigment and has on its surface a thermally fusible material in the form of a large number of dots or in the form of lines to divide the surface into different areas.

7. The image transfer sheet of claim 6, wherein the image formation layer has a thickness of 0.1 to 1.5 μm.

8. The image transfer sheet of claim 6, wherein a ratio of the pigment to the thermoplastic resin in the image formation layer is in the range of 0.5/1 to 4/1.

9. A laminate for image formation which comprises, an image transfer sheet comprising, in order, a support sheet, a light-heat conversion layer containing a light-heat conversion material which absorbs a laser light and instantly produces a heat and a material which produces a gas upon receiving the heat produced by the light-heat conversion material, and an image formation layer which comprises a thermoplastic resin and a pigment, and an image receiving sheet via a thermally fusible material in the form of a large number of dots or in the form of lines to divide an interface between the image formation layer and the image receiving sheet into different areas.

10. An image forming method comprising the steps of:

applying a laser light imagewise and sequentially onto the laminate for image formation of claim 9; and separating the image receiving sheet from other materials of the laminate so as to keep on the image receiving sheet an imagewise transferred image formation layer comprising the thermoplastic resin and pigment.

* * * * *